US005417212A

United States Patent [19]
Szeles

[11] Patent Number: 5,417,212
[45] Date of Patent: May 23, 1995

[54] APPARATUS FOR DETERMINING THE LOCATION OF RECEPTOR REGIONS

[76] Inventor: Josef C. Szeles, Glanzinggasse 5/7, A-1190 Wien, Austria

[21] Appl. No.: 261,755

[22] Filed: Jun. 17, 1994

Related U.S. Application Data

[63] Continuation of Ser. No. 659,309, filed as PCT/AT89/00106, Nov. 21, 1989, abandoned.

[30] Foreign Application Priority Data

Nov. 21, 1988 [AT] Austria .................. 2845/88

[51] Int. Cl.6 .......................... A61B 5/00; A61B 5/055
[52] U.S. Cl. .................. 128/653.1; 128/653.2; 128/653.5
[58] Field of Search ............... 128/653.1, 653.2, 653.5; 606/130; 324/309, 318; 378/4, 162, 163, 166, 204

[56] References Cited

U.S. PATENT DOCUMENTS

| | | |
|---|---|---|
| 4,117,337 | 9/1978 | Staats . |
| 4,240,439 | 12/1980 | Abe et al. . |
| 4,242,587 | 12/1980 | Lescrenier . |
| 4,506,676 | 3/1985 | Duska .................. 128/653.1 |
| 4,583,538 | 4/1986 | Onik et al. .................. 128/653.1 |
| 4,638,798 | 1/1987 | Sheldon et al. .................. 128/653.1 |
| 4,702,257 | 10/1987 | Moriyama et al. . |
| 4,773,957 | 10/1988 | Namby et al. .................. 128/653.2 |
| 4,860,331 | 8/1989 | Williams et al. .................. 606/130 |
| 4,869,247 | 9/1989 | Howard, III et al. .................. 606/130 |
| 4,930,509 | 6/1990 | Brisson .................. 128/653.1 |
| 4,953,555 | 9/1990 | Leupold et al. .................. 128/653.2 |
| 4,991,579 | 2/1991 | Allen .................. 606/130 |
| 5,050,608 | 9/1991 | Watanabe et al. .................. 128/653.1 |
| 5,063,933 | 11/1991 | Takahashi .................. 128/653.2 |
| 5,066,915 | 11/1991 | Omori et al. .................. 324/318 |
| 5,078,140 | 1/1992 | Kwoh .................. 606/130 |
| 5,165,410 | 11/1992 | Warne et al. .................. 128/653.1 |

FOREIGN PATENT DOCUMENTS

| | | |
|---|---|---|
| 148566 | 7/1985 | European Pat. Off. . |
| 212716 | 7/1986 | European Pat. Off. . |
| 2554705 | 5/1985 | France . |
| 2556958 | 6/1985 | France . |
| 2659115 | 7/1978 | Germany . |

OTHER PUBLICATIONS

SU 1237-209A 6/86 Russia.

Primary Examiner—Krista M. Pfaffle
Attorney, Agent, or Firm—Collard & Roe

[57] ABSTRACT

An apparatus for determining the location of receptor regions including a nuclear resonance tomograph and an indicator device for the skin sites located directly above the receptor regions. The indicator device is in the form of one or more, preferably non-magnetic, indicator elements which can be placed on the skin, or a light marker device connected with the display unit of the nuclear resonance tomograph. The light marker device places a mark on the skin site located above the measurement area.

10 Claims, 5 Drawing Sheets

APPARATUS FOR DETERMINING THE LOCATION OF RECEPTOR REGIONS

CROSS-REFERENCE TO RELATED APPLICATION

This is a continuation of my application Ser. No. 07/659,309, filed as PCT/AT89/00106 on Nov. 21, 1989, now abandoned.

BACKGROUND OF THE INVENTION

1. Field of the Invention

The invention relates to an apparatus for determining the location of receptor regions with a device which records the physical properties of the tissue in the area of the receptor regions by means of measurement technology.

2. The Prior Art

There is a stimulation-conduction relationship between individual body parts and receptor regions which are located below the skin surface at other locations of the body. By stimulating the receptor regions, influence can be exerted on the body parts assigned to these receptor regions. This relationship is utilized in acupuncture to influence body parts located at other locations of the body by stimulating points or areas located below the skin surface. For stimulation of such points or areas, needles can be inserted into the surface of the body. The receptor regions are relatively small, generally smaller than 1 mm, and for an effective influence on the body parts assigned to a receptor region, it is necessary that stimulation takes place precisely at the location of the receptor region in question.

It is possible to influence symptoms present at certain body parts, or pain conditions resulting from such symptoms, by stimulating receptor regions, resulting in normalization or improvement of the condition.

When changes or pain sensations resulting from such changes are present, changes in nerve activity also occur at the receptor regions which are assigned to the body parts affected, which change the condition of the tissue in the area of the receptor regions; in most cases, changes in the fluid distribution (fluid shifts) occur in these tissue areas. However, in the receptor regions, deviations as compared with the surrounding tissue can be present even without changes being demonstrated by the related body parts, which make the location of the receptor regions evident. It is also possible to improve the recognition of the receptor regions by influencing the body parts assigned to the receptor regions.

With a known apparatus of the type mentioned initially, an attempt has been made to determine the location of receptor regions used for acupuncture by determining the membrane potentials in the area of the skin being considered, using measurement technology, by means of electrodes placed on the skin and by means of a voltage measuring device connected with them, and by drawing conclusions concerning the location of the areas in question from the measured shift in potential. It is also known to measure the electrical resistance in the region of the skin, instead of or as a supplement to such potential measurements, and to conclude the position of points used for acupuncture from the measurement values obtained, and also, if necessary, to use auxiliary voltages or auxiliary currents which are supplied with additional electrodes or with the measurement electrodes themselves, both for the potential measurements and for the resistance measurements. The reliability of these known techniques is not satisfactory, particularly because the skin has irregular levels of keratinization in its outer layer and this detrimentally affects the electrical measurements; however, there are inherently very different tissue properties in those areas in which the receptor regions are located, and these differences, which are superimposed on the changes to be determined, cannot be satisfactorily eliminated with the known systems, even when using electrodes inserted through the skin surface, which is not only felt to be unpleasant due to the large number of measurement points necessary, as a rule; but can also result in changes, caused by the unpleasant sensations, which detrimentally affect the measurement.

A measurement of the electrical potential or the magnetic field strength which are present at individual points of a skin area, to determine the location of points to be used for acupuncture, is also described in DE-A-2 928 826. Here, sensors which detect the fields in a very small area are used for measurements, and these sensors are guided over the skin area to be examined during the measurement.

SUMMARY OF THE INVENTION

It is a goal of the present invention to create an apparatus of the type mentioned initially, with which the exact location of receptor regions can be rapidly determined in a manner which puts as little stress as possible on the person in question; in particular, it should be possible to determine the exact location of those receptor regions in the immediate vicinity of which changes in the tissue, particularly changes in fluid distribution (fluid shift), have occurred, due to the fact that changes are present at the body parts assigned to these receptor regions.

The apparatus according to the invention, of the type mentioned initially, is characterized by the fact that the device which records the physical properties of the tissue is a nuclear resonance tomograph, and that the apparatus furthermore has an indicator device for the skin sites located directly above the receptor regions, in the form of a marking device connected with the imaging unit of the nuclear resonance tomograph, with which a mark can be placed on the skin site located above the measurement area, or in the form of at least one indicator element arranged on a manipulator provided with positioning elements. With this apparatus, the goal stated above can be fulfilled well, and an exact determination of the location of receptor regions can be achieved in a manner which places hardly any stress on the person in question. The skin sites located above the receptor regions can be precisely marked, so that there is a guarantee that when stimulating the skin sites indicated with the apparatus according to the invention, e.g. with a needle inserted for stimulation, the receptor regions will be reached; in general, the relationship which exists between body parts and receptor regions can be precisely localized. Nuclear resonance tomographs are also frequently called MRI (magnetic resonance imaging) equipment.

It can be mentioned that it is known from EP-A-0 228 692 to arrange indicator elements on the skin surface during a diagnostic examination of the body with a nuclear resonance tomograph to determine injuries to internal organs; these elements are also imaged and are used to obtain an indication of the location of the organs or injuries in the body.

A preferred embodiment of the apparatus according to the invention is characterized by the fact that the nuclear resonance tomograph is structured to record the distribution of hydrogen atoms or protons in the tissue. This structure allows a particularly advantageous determination of the fluid shift present in the tissue and is furthermore also advantageous with regard to the sensitivity which can be achieved with nuclear resonance tomography. It is furthermore advantageous if the nuclear resonance tomograph is a low field nuclear resonance tomograph, because this counteracts the possible occurrence of changes in the tissue condition in the area of the receptor regions which are caused by the magnetic field of the tomograph, to the greatest possible extent.

With regard to achieving the simplest possible structure of the nuclear resonance tomograph and with regard to the simplest possible recording of the areas of tissue to be imaged, the approximate location of which is already known, as well as with regard to achieving a clearly recognizable image of tissue changes in a small area, which are generally present in the immediate vicinity of the receptor regions which are of interest in each case, an embodiment of the apparatus according to the invention characterized by the fact that at least the receiver coil of the nuclear resonance tomograph, or a transmitter and receiver coil of the same, and, if necessary, also a transmitter coil of the nuclear resonance tomograph, is (are) structured as (a) movable element (s), which can be placed directly in the measurement area, e.g. on the ear or on a location of the torso.

If an indicator element is provided with the apparatus according to the invention, this should generally be non-magnetic, i.e. also not magnetizable, so that no forces which cause shifts are exerted on it by the magnetic field required for nuclear resonance tomography, and so that the magnetic field required for nuclear resonance tomography does not undergo any distortion. However, it is also possible to structure such an indicator element in such a way, by specific selection of the material and shape, that a special distortion of the magnetic field occurs in its immediate vicinity, which makes it possible to achieve a shape of the imaging surfaces which is especially advantageous for determining the location of receptor regions, which can be curved instead of flat, for example. The location of the indicator element can be brought into relationship with the nuclear resonance tomography image of the tissue in simple manner, by imaging the indicator element itself with the nuclear resonance tomograph, and thereby making it visible on the imaging unit of the nuclear resonance tomograph together with the nuclear resonance tomography image of the surroundings of the receptor regions; by simply moving the indicator element over the skin surface in the area of the receptor regions whose exact location is to be determined, the image of the receptor regions can be made to converge with the image of the indicator element, which means that the indicator element is located above the receptor region in question. In this way, the location of this receptor region has been determined. If subsequent stimulation of this receptor region is planned, the indicator element can be left in place, and fixed in place, if necessary, or a marking can be placed on the skin, for example with a suitable dye, at the corresponding location of the skin, in order to designate the location of the receptor regions as indicated by the location of the indicator element.

A variation of the embodiment mentioned above is characterized by the fact that the positioning elements of the manipulator, on which the indicator element is arranged, are connected with the imaging unit of the nuclear resonance tomograph or with adjusters in the control and computer unit of the nuclear resonance tomograph, which in turn are coupled with the imaging unit, to image the location of the indicator element on the imaging unit. This variation allows simple and rapid determination of the location of the receptor regions, from the point of view of operation of the apparatus, because the indicator element can be made to converge with the image of a receptor region by observing a mark which is visible on the imaging unit of the nuclear resonance tomograph, which indicates the position of the indicator element in each instance, where the indicator element is placed on the skin site located above the receptor region, using the manipulator, and the location of the indicator element in each instance is coordinated with the mark visible on the imaging unit, by means of the positioning element of the manipulator.

If a marking device is provided instead of an indicator element, the location of the receptor region which can be seen on the imaging unit of the nuclear resonance tomograph can be made visible directly, by means of a marking on the skin site located above the receptor region in question, produced with this marking device; the marking can be a light mark or a dye mark, for example. In this case, similarly as was explained above in connection with an indicator element, the marking, which causes warming of a small area of skin, for example, can be depicted on the imaging unit of the nuclear resonance tomograph together with the surroundings of the receptor region; by corresponding adjustment of the marking device, the image of the mark can be made to converge with the image of the receptor region, and thus the location of the receptor region can be designated on the skin site located above this receptor region. Simpler operation and faster determination of the location of the receptor region in question is possible with an embodiment of the apparatus according to the invention which is characterized by the fact that at least one marking device which forms optical markings on the skin area located above the measurement area is provided, which is provided with a manipulator having a positioning element, or arranged on such a manipulator, where these positioning elements are connected with the imaging unit of the nuclear resonance tomograph or with adjusters in the control and computer unit of the nuclear resonance tomograph, which in turn are coupled with the imaging unit, to image the location of the marking device on the imaging unit. Again, with this embodiment, the mark on the imaging unit of the nuclear resonance tomograph corresponding to the actual location of the marking device simply has to be made to converge with an image of a receptor region presented there, by suitable adjustment of the manipulator, in order to align the marking device with a skin site located above a receptor region.

A very simple embodiment is characterized by the fact that the marking device is a light marker. With this structure of the apparatus, work can be carried out in such a way that first, a nuclear resonance tomography image of the relevant receptor region is formed on the imaging unit of the nuclear resonance tomograph, that after this, the measurement device of the nuclear resonance tomograph is shut off and any equipment parts of the nuclear resonance tomograph which cover the body part being; examined, such as transmitter coils or receiver coils, for example, are removed, and that then, utilizing the said image, the marking device is brought into a condition which indicates the skin site located above the receptor region in question. The light marking obtained in this way can be generally used for determining relationships between body parts and receptor regions or, if desired, for precise localization of stimulation points. With regard to an exact display of the position of the receptor regions and with regard to a simple structure of the light beam guidance, it is advantageous if the light marker is a laser marker.

If the marking is also supposed to be visible for some time outside the apparatus with which it was produced, e.g. in case evaluation or stimulation will not be carried out until some time after the determination of location of the receptor regions, an embodiment of this apparatus which is characterized by the fact that the marking device is a dye application device, preferably a dye dot application device, is advantageous. The dye application device can be a dye droplet spin device, for example, with which dye droplets are spun from a capillary to the point to be marked, by electric activation.

BRIEF DESCRIPTION OF THE DRAWINGS

The invention will now be explained in greater detail with reference to examples which are shown schematically in the drawing.

The representations in the drawing are kept purely schematic, and in particular, the size relationships between the individual elements shown were selected only with the aim of making the relationships as easily recognizable as possible, without any consideration of the actual dimensions. The drawing shows.

DETAILED DESCRIPTION OF THE PREFERRED EMBODIMENT

Figure 1:
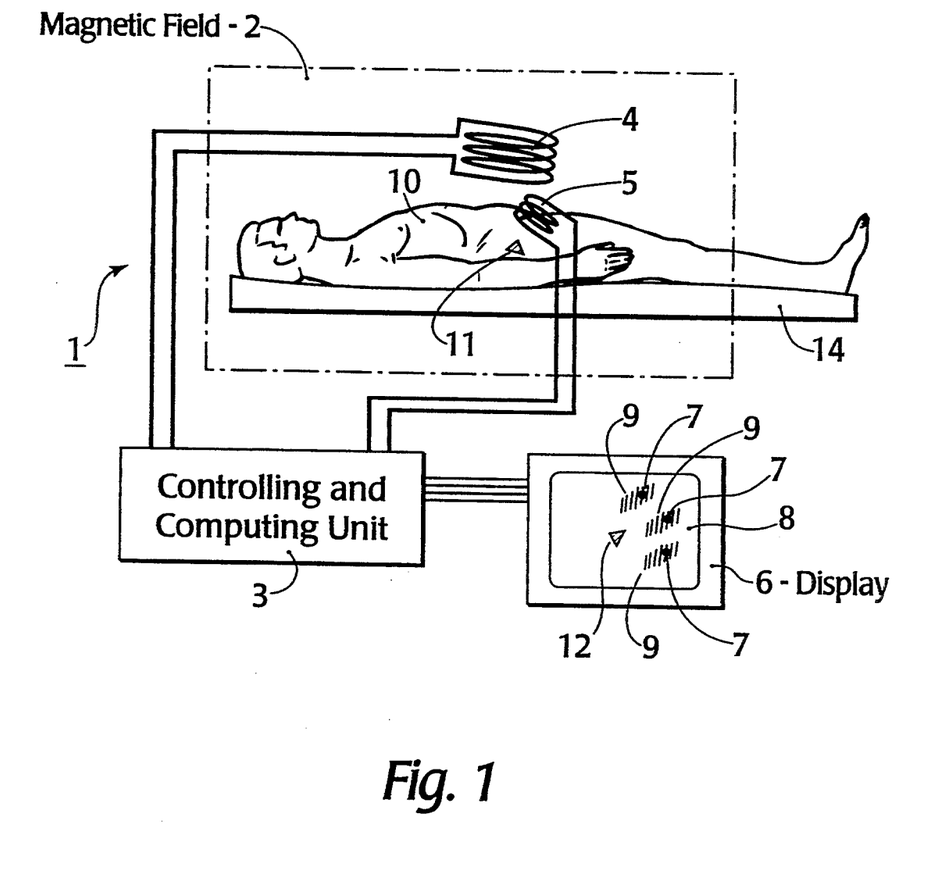
FIG. 1, a first embodiment of an apparatus structured according to the invention.

In the embodiment of an apparatus for determining the location of receptor regions shown in FIG. 1, a nuclear resonance tomograph 1 is provided, which has a magnetic unit, now shown in greater detail, with which a magnetic field 2 is produced, which completely fills the examination area and is schematically indicated with a dot-dash rectangle. The nuclear resonance tomograph I is equipped with a control and computer unit 3, to which the transmitter coil 4 and the receiver coil 5 are connected. Furthermore, the imaging unit 6 of the nuclear resonance tomograph is connected to the control and computer unit 3. Using this imaging unit, an image of areas located below the skin, in which receptor regions 7 are located or presumed to exist, is produced; with the deviations mentioned above, which are present in the immediate vicinity of the receptor regions 7 in comparison with the surrounding tissue 8, namely, in particular, changes in the fluid distribution (fluid shift), the immediate surroundings 9 of the receptor regions 7 differ in image from the image of the surrounding tissue 8, and the receptor regions 7 can thus be recognized. To indicate the skin sites located immediately above the receptor regions on the body 10 of the person examined using the nuclear resonance tomograph, an indicator element 11 is provided, which can be moved over the skin surface; the indicator element 11 can, in turn, be imaged in the form of a mark 12 on the imaging unit 6, and observing or utilizing this mark 12, moved over the surface of the body 10, until it is located directly at a receptor region 7. The person being examined rests on a support 14, e.g. an examining table, which prevents undesirable movements which could impair the accuracy of the location determination, to a significant extent. As a rule, it is advantageous to provide a larger transmitter coil and a receiver coil which is smaller, in comparison; it is practical if the receiver coil 5 is structured as a movable element, which is arranged in the immediate vicinity of the areas to be recorded or imaged, and can be held in place there with a suitable holder; it is advantageous if the receiver coil is structured as a surface coil; it is practical if the receiver coil is turned on after the transmitter coil, which was previously turned on, is turned off, using suitable controls in the control and computer unit. It is also possible to provide a combined transmitter and receiver coil, which is controlled by the control and computer unit in known manner. With regard to the extremely high resolution of the image, and with regard to the high sensitivity which can be achieved with this, a nuclear resonance tomograph structured for high magnetic field strength (0.5 T to 2.5 T) can be provided in the apparatus. In many cases, however, it is also advantageous to work at low magnetic field strength (low field nuclear resonance tomograph), in order to exert as little influence as possible on the sensitive processes in the surroundings of the receptor regions.

Figure 2:
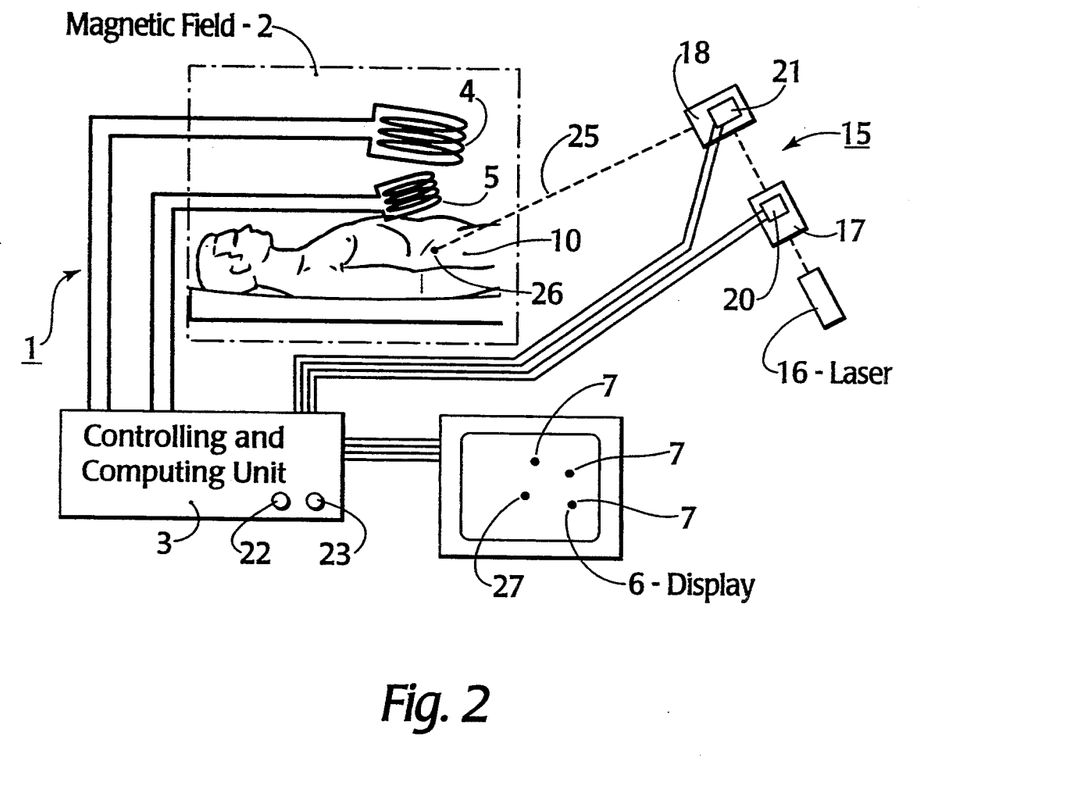
FIG. 2, another embodiment of such an apparatus, with a marking device structured as a laser marker.

In the embodiment of an apparatus according to the invention shown in FIG. 2, an optical marking device in the form of a laser marker is provided to indicate the skin sites located directly above the receptor regions. This laser marker 15 has a laser light source 16 and two laser beam deflection units 17, 18, in which active positioning elements 20, 21 are arranged, which are connected with the control and computer unit 3 of the nuclear resonance tomograph. The positioning elements 20, 21 can be controlled using adjustment elements 22, 23, which are provided on the control and computer unit 3, and in this way, the laser beam 25 which points towards the area being examined can be moved using the laser beam deflection units 17, 18, and, at the same time, a mark 27 is shown on the imaging unit 6, corresponding to the impact point 26 of the laser beam 25 on a skin site located in the examination area, via the connection between the control and computer unit 3 and the imaging unit 6. By operating the adjustment elements 22, 23, the laser beam 25, i.e. the impact point 26, and, concurrent with it, the mark 27 can be adjusted in terms of coordinates, until the mark 27 is made to converge with a receptor region 7 that is imaged, and then the impact point 26 of the laser beam 25 indicates the skin site located directly above the receptor region.

Figure 3:
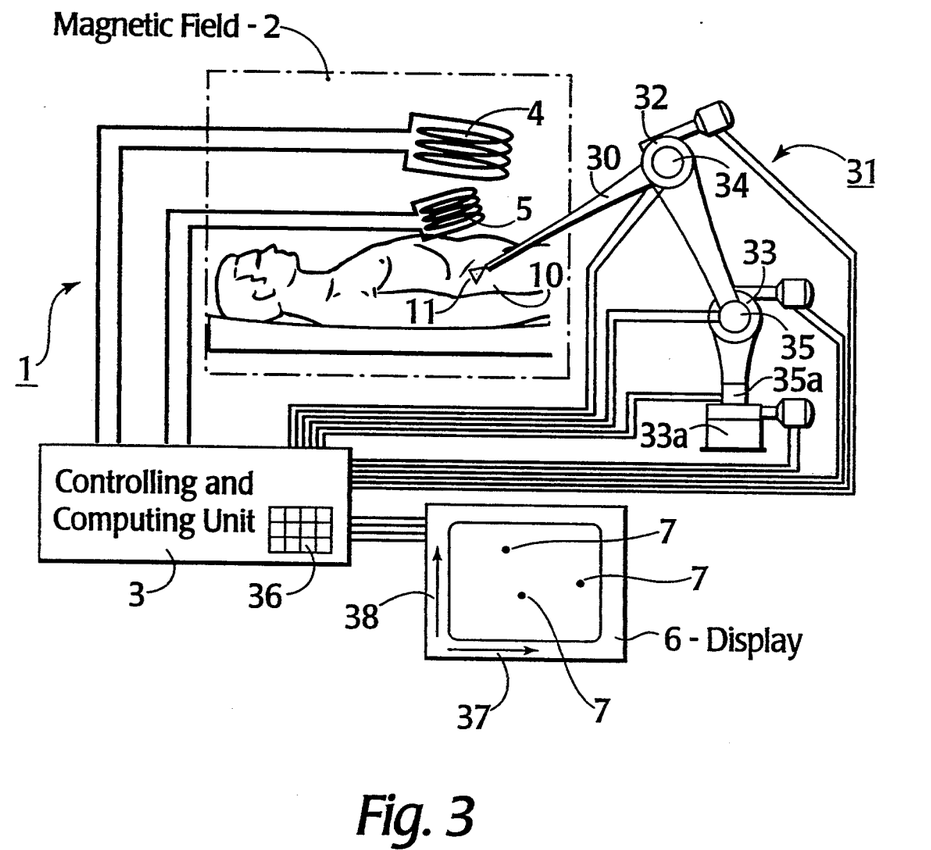
FIG. 3, another embodiment of such an apparatus, with an indicator element arranged at a manipulator.

In the embodiment of an apparatus according to the invention shown in FIG. 3, an indicator element 11 is provided to indicate the skin sites located above the receptor regions 7 shown on the imaging unit, in the examination area or measurement area, similar to the embodiment according to FIG. 1. This indicator element 11 is attached on the arm 30 of a power manipulator 31, which is equipped with pivot units 32, 33, 33a, which are controlled from the control and computer unit 3. Passive positioning elements 34, 35, 35a are arranged in the pivot units 32, 33 33a; these are also connected with the control and computer unit 3 of the nuclear resonance tomograph and give off signals from which the position of the indicator element 11 at any particular time is evident. The power manipulator 31 can be controlled with an input unit 36, where the position which the indicator element 11 is supposed to have can be set in terms of coordinates. In this way, after the image of the body area containing the receptor regions 7 which are of interest is obtained on the imaging unit 6, the coils of the tomograph can be turned off, and, if necessary, removed from the examination or measurement area, and, if necessary, the magnetic field can also be turned off, after which the indicator element 11 can be moved to a skin site located directly above such a receptor region, using the input unit 36, corresponding to the coordinates 37, 38 at which the images of the receptor regions 7 are located.

Figure 4:
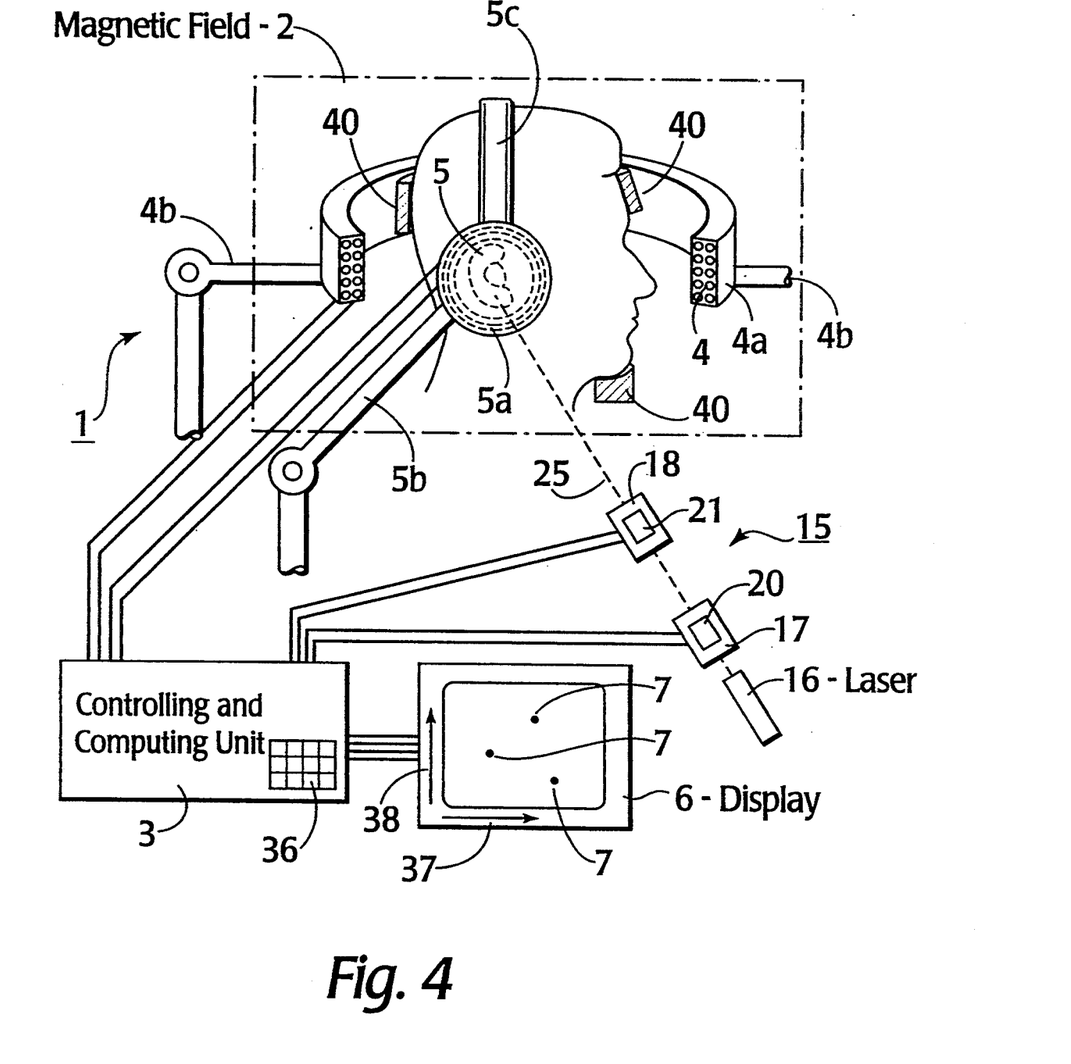
FIG. 4, an embodiment of an apparatus according to the invention in which the transmitter coil and the receiver coil of the nuclear resonance tomograph are structured as movable elements.

In the embodiment of an apparatus according to the invention shown in FIG. 4, both the transmitter coil 4 and the receiver coil 5 are structured as movable elements and arranged on suitable carriers 4a, 5a which can be fixed in place. The carrier 4a is structured in the form of a ring which can be attached at the frame of the nuclear resonance tomograph via support arms 4b, and the carrier 5a has the form of a bowl which sits on a carrier arm 5b which leads to the frame of the nuclear resonance tomograph, and which can be placed on the area of the body to be examined. For the part of the body to be examined, the head in the case shown here, support points 40 which secure the position are provided. To position the coil carrier 5a with the receiver coil 5, an auxiliary carrier 5c structured similar to a headset strap can also be provided, if necessary. It is advantageous if the receiver coil 5 is structured as a surface coil. It is furthermore advantageous to turn on the receiver coil 5 on after turning off the transmitter coil 4, which was previously turned on, using suitable controls in the control and computer unit 3. The embodiment of an apparatus according to the invention shown in FIG. 4 is particularly suitable for determining the location of receptor regions which are located on the head, especially on the ear. Again, with this apparatus, an optical marking device in the form of a light marker, especially a laser marker, is provided to indicate the skin sites located directly above the receptor regions; with this marking device, the skin sites in question can be indicated after the transmitter coil and the receiver coil have been shut off and removed. A laser marker 15 can be provided, as provided in the embodiment according to FIG. 2, or other versions of such laser markers can be used. A laser marker which has a similar structure as the one shown in FIG. 2 is shown, and which can be adjusted in terms of coordinates with an input unit 36, corresponding to the coordinates 37, 38 which the images of the receptor regions 7 have on the imaging unit 6, in order to indicate the skin site located above the receptor regions.

Figure 5:
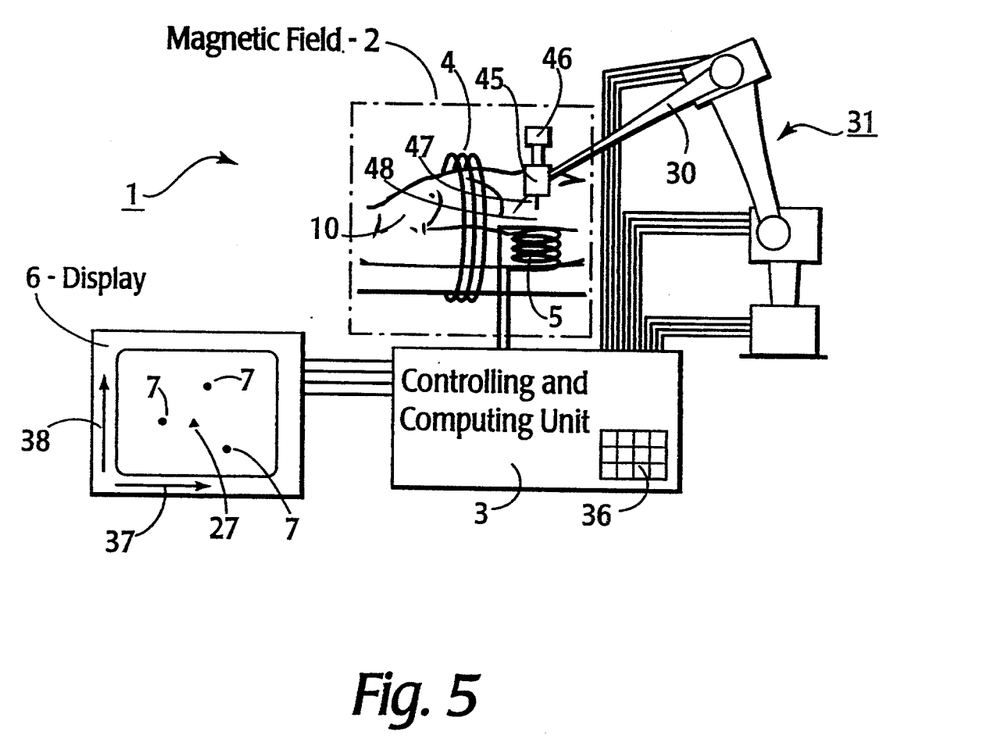
FIG. 5, an apparatus with a marking device structured as a dye dot application device.

In the embodiment shown in FIG. 5, a marking device in the form of a dye dot application device 45 is provided to identify the skin sites located directly above the receptor regions determined; tiny droplets of a marking fluid contained in a container 46 can be applied to a skin site 48 located in front of the nozzle 47 of this dye dot application device, which is electrically controlled. The dye dot application device 45 is mounted on a pivot arm 30 of a power manipulator 31, which has a structure similar to the power manipulator provided in the embodiment according to FIG. 3. A coordinate control of the power manipulator, using an input unit 36, similar to the embodiment according to FIG. 3, can be provided, or an analog control with adjustment elements can be provided. With the analog control, a mark is produced on the imaging unit of the nuclear resonance tomograph via the positioning element of the power manipulator, the position of which corresponds to the position of the dye dot application device at that time, and observing this mark 27, the dye dot application device is steered to the skin sites located directly above the receptor regions and then marking of these skin sites is triggered.

I claim:

1. An apparatus for displaying, identifying and indicating receptor regions within tissue and under skin of a patient, the apparatus comprises:
   a nuclear resonance tomograph means having a magnet and at least one coil and a controlling and computing unit; said tomograph means for generating images of physical properties of said receptor regions of said patient;
   a display means coupled to said nuclear resonance tomograph means for displaying the physical properties of the tissue and for identifying said receptor regions; and
   a light marker means connected to said controlling and computing unit for indicating skin sites directly above the receptor regions as identified on said display means.

2. The apparatus according to claim 1, wherein said light marker means comprises means for positioning said light marker means, said means for positioning said light marker means connected to and controlled by said controlling and computing unit.

3. The apparatus according to claim 1, further comprising means for displaying a location of the light marker means on said display means.

4. The apparatus according to claim 3, further comprising means for connecting said controlling and computing unit to said display means.

5. The apparatus according to claim 1, wherein said nuclear resonance tomograph means records the distribution of at least one of hydrogen atoms and protons in the tissue.

6. The apparatus according to claim 1, wherein said nuclear resonance tomograph means is a low field nuclear resonance tomograph.

7. The apparatus according to claim 1, wherein said at least one coil includes a movable receiver coil adapted for placement directly on the skin and further includes a transmitter coil.

8. The apparatus according to claim 1, wherein said at least one coil includes a movable combined transmitter and receiver coil adapted for placement directly on the skin.

9. The apparatus according to claim 1, wherein said light marker means is a laser marker means.

10. An apparatus for displaying, identifying and indicating receptor regions within tissue and under skin of a patient, the apparatus comprising
    nuclear resonance tomograph means for generating images of physical properties of the receptor regions of the patient including
    (i) a magnet, (ii) at least one coil means for transmitting and receiving signals, (iii) a controlling and computing unit having adjustment means, said controlling and computing unit controlling the transmission and reception of said signals and generating image signals from said received signals;

a display means coupled to said controlling and computing unit for receiving said image signals and displaying the physical properties of the tissue to identify said receptor regions;

a light marker means for indicating skin sites located directly above the receptor regions as identified on said display means, said light marker means including a light beam source emitting a light beam, and positioning means for positioning the light beam, said positioning means being connected to said adjustment means, said adjustment means mans controlling said positioning means to move said light beam and for moving move a mark on said display means corresponding to said light beam.

* * * * *